US006446332B1

(12) United States Patent
Simon

(10) Patent No.: US 6,446,332 B1
(45) Date of Patent: Sep. 10, 2002

(54) PROCESS AND DEVICE FOR CONNECTING A PROBE TO A PRINTED CIRCUIT BOARD BY MEANS OF A PLUG CONNECTOR WITH TWO HALF-SHELLS

(75) Inventor: Clemens Simon, Starnberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/486,279

(22) PCT Filed: May 18, 1999

(86) PCT No.: PCT/DE99/01477

§ 371 (c)(1),
(2), (4) Date: May 19, 2000

(87) PCT Pub. No.: WO99/67856

PCT Pub. Date: Dec. 29, 1999

(30) Foreign Application Priority Data

Jun. 25, 1998 (DE) ........................................ 198 28 314

(51) Int. Cl.$^7$ .................................................. H05K 3/30

(52) U.S. Cl. ............................ 29/832; 29/740; 29/747; 29/840

(58) Field of Search .......................... 29/825, 827, 832, 29/840, 739, 747, 740

(56) References Cited

U.S. PATENT DOCUMENTS 4,429,454 A 2/1984 Dines et al.
6,167,613 B1 * 1/2001 Jarrett et al. .................. 29/739

FOREIGN PATENT DOCUMENTS

| | | |
|---|---|---|
| DE | 42 35 181 | 7/1993 |
| EP | 0 375 905 | 7/1990 |
| EP | 0 613 216 | 8/1994 |

* cited by examiner

*Primary Examiner*—Carl J. Arbes
(74) *Attorney, Agent, or Firm*—Kenyon & Kenyon

(57) ABSTRACT

A method for connecting a probe whose electrical connections end on a circuit board that can be introduced into a receptacle of a connector plug that comprises two half-shells which carry on sides facing one another the mating contacts for the connections of the circuit board and between them form a receptacle for the circuit board, the half-shells being held together under tension by way of a U-shaped spring which surrounds them. Creation of the join can be substantially simplified, with no risk of damage to the parts, by the fact that the connector plug is introduced between two displacing jaws and is positioned such that spreader extensions of the displacing jaws are directed toward the opening of the spring; that by opposite-direction displacement of the spreader extensions introduced into the opening of the spring, the spring is spread apart over a predefined displacement; that the circuit board is introduced into the receptacle, which can now be enlarged, between the half-shells; and that the circuit board is then, as a result of contraction and/or extension of the spreader extensions, held under tension between the half-shells of the connector plug by way of the released spring.

14 Claims, 3 Drawing Sheets

PROCESS AND DEVICE FOR CONNECTING A PROBE TO A PRINTED CIRCUIT BOARD BY MEANS OF A PLUG CONNECTOR WITH TWO HALF-SHELLS

BACKGROUND INFORMATION

The present invention relates to a method and an apparatus for connecting a probe whose electrical connections end on a circuit board that can be introduced into a receptacle of a connector plug that comprises two half-shells which carry on sides facing one another the mating contacts for the connections of the circuit board and between them form a receptacle for the circuit board, the half-shells being held together under tension by way of a U-shaped spring which surrounds them.

The probe is connected to a connector plug to which, as a rule, a prefabricated wiring harness is already attached. The half-shells are often ceramic parts that can easily be damaged. Simply plugging the circuit board of the probe into the receptacle of the connector plug is therefore out of the question. The half-shells are under a compressive force, generated by the spring surrounding them, that upon introduction of the circuit board would need to be exerted on the spring via the half-shells and overcome. Since the ceramic half-shells are very brittle, forceful manual introduction of the circuit often results in damage to the half-shells and to the mating contacts, which are very sensitive to shifting movements especially if the overall geometry is very small (approx. 1 $cm^3$) and the compressive force is very large. The spring can also be plastically deformed, since it has a very steep characteristic curve and can very easily be overextended.

SUMMARY OF THE INVENTION

It is an object of the invention to create a method and an apparatus of the kind mentioned initially in which the circuit board of the probe can be introduced into the connector plug with no risk of damage thereto or to the half-shells having the mating contacts, and which can be performed with no adverse effect on spring characteristics.

According to the present invention, the method is embodied in such a way that the connector plug is introduced between two displacing jaws and is positioned such that spreader extensions of the displacing jaws are directed toward the opening of the spring; that by opposite-direction displacement of the spreader extensions introduced into the opening of the spring, the spring is spread apart over a predefined displacement travel; that the circuit board is introduced into the receptacle, which can now be enlarged, between the half-shells; and that the circuit board is then, as a result of contraction and/or extension of the spreader extensions, held under tension between the half-shells of the connector plug by way of the released spring.

The displacement movements are preferably coordinated with one another in such a way that the movement by which the connector plug is introduced between the displacing jaws is limited by stops which define the positioning of the connector plug in the introduction direction; and that the displacing jaws are displaced parallel to the wide side of the receptacle between the half-shells of the connector plug; and that the spreader extensions, the positioning extensions, and the tracking extensions are respectively displaced in opposite directions, but parallel to the narrow side of the receptacle. For defined retention of the spring as it is spread, provision can also be made for the spring to be retained, on the side facing away from the opening, by way of a retaining extension of the displacing jaw.

The advantage of this feature is that it can be performed precisely with an apparatus; a very short cycle time can be achieved with the method steps, i.e. with the corresponding displacement of the displacing jaws. In addition, the method can also be used with a very small overall geometry, since the connector plug and spring in each case need to be brought into effective connection only via extensions of the displacing jaws. According to a particularly simple embodiment, provision can be made for positioning of the connector plug to be performed with positioning extensions of the displacing jaws that are introduced into positioning receptacles of the half-shells of the connector plug or are brought into contact against positioning surfaces of the half-shells, and are displaced synchronously with the spreader extensions of the displacing jaws.

If provision is made, according to a development, for the displacing jaws to be introduced with tracking extensions into associated tracking receptacles of the half-shells, or placed against tracking surfaces thereof, and for the opposite-direction displacement of the tracking extensions of the half-shells of the connector plug to track, in stress-free-fashion, the spreading of the spring, the receptacle is then enlarged automatically as the spring is spread and tracks the spring, but the half-shells are not pressed against the spring. Introduction of the circuit board into the receptacle of the connector plug is thereby facilitated, and damage to the circuit board or half-shells is prevented, even at very small dimensions.

The method according to the present invention can also be used to detach the probe from the connector plug. This is done by performing the method steps in the same sequence except that when the spring is spread, the circuit board of the probe is pulled out of the expanded receptacle between the half-shells of the connector plug before the spring is then released.

An apparatus for carrying out the method is characterized in that the displacing jaws are arranged on both sides of the connector plug and are movable toward and away from one another; that the displacing jaws comprise in each case a stack of plates, arranged one above another, on which the positioning extensions and spreader extensions are shaped on the sides facing one another; that the plates are displaceable in opposite directions perpendicular to the displacing movements of the displacing jaws, the plates displaceable in the one direction being equipped with a receiving orifice for a first displacement stud and the plates displaceable in the opposite direction being equipped with a receiving orifice for a second displacement stud; that the plates displaceable in the one direction have an elongated guide hole for the second displacement stud, and the plates displaceable in the opposite direction have an elongated guide hole for the first displacement stud; and that the displacement studs are arranged, as eccentric studs, on drive wheels that can be driven in opposite rotation directions.

The displacement studs that are movable toward or away from one another, which are arranged as eccentric studs on the two drive wheels, make it easy to achieve the opposite-direction displacement movements of the positioning and spreader extensions and transfer them to the half-shells and to the spring of the connector plug. Of course the plates can also have other extensions for gripping, grasping, moving apart, or bringing together other objects, and the apparatus can be used as a grasping tool for other applications.

According to an advantageous embodiment, provision is made for the drive wheels to be configured as gear wheels which are in engagement with one another and of which at least one is drivable.

In order to achieve an unimpeded opposite-direction displacement movement for the plates, the design is such that the elongated guide holes are oriented in the displacement directions of the plates, and have a longitudinal dimension which is greater than the maximum displacement travel of the plates.

Correct engagement of the positioning and spreader extensions against the connector plug that is to be processed is ensured by the fact that the positioning extensions and the spreader extensions and tracking extensions can be directed, within the stack height, toward the positions of the positioning receptacles or positioning surfaces on the connector plug introduced between the displacing jaws, and the spreader extensions can be directed toward the position of the opening of the spring.

DETAILED DESCRIPTION

Figure 1:
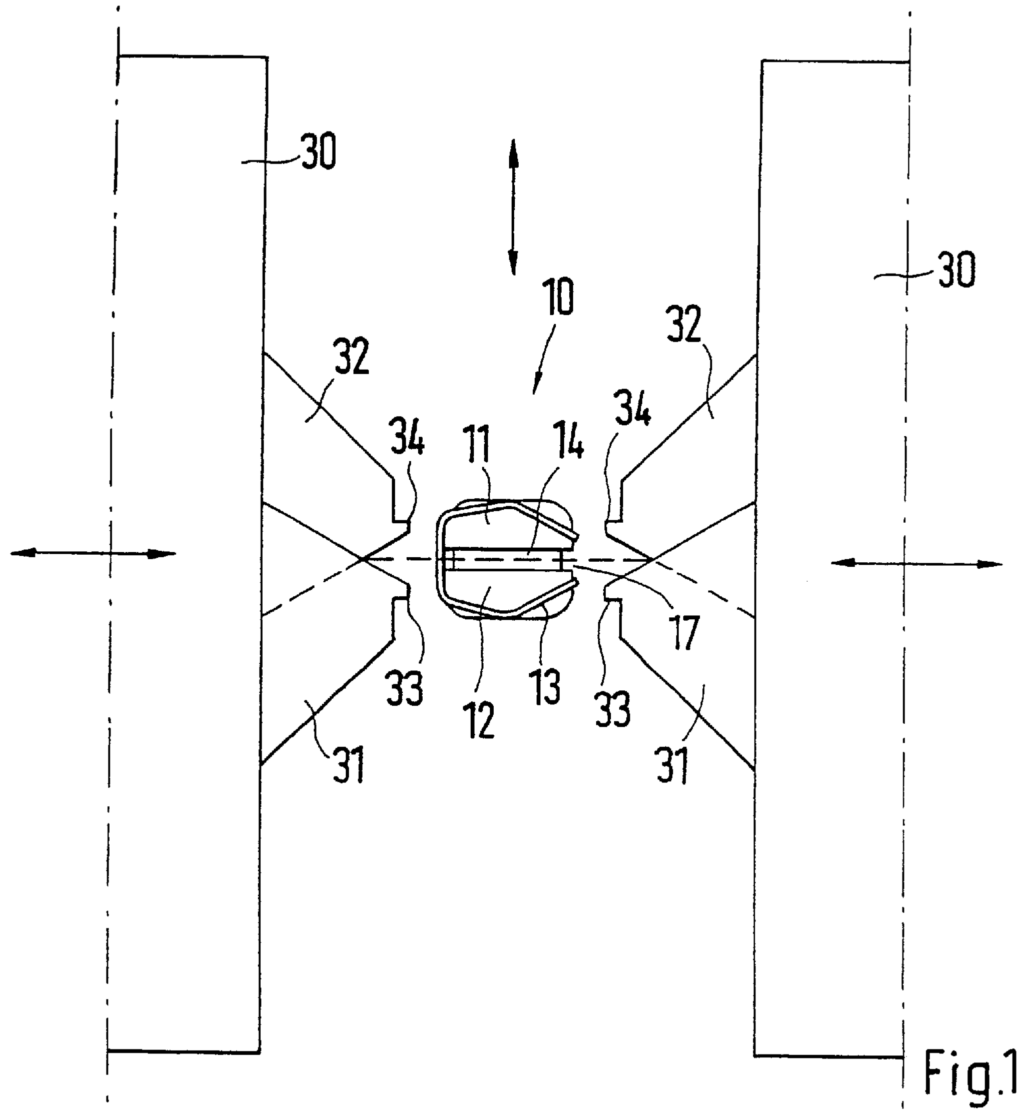
FIG. 1 shows, in plan view, a connector plug introduced between two displacing jaws.
Figure 2:
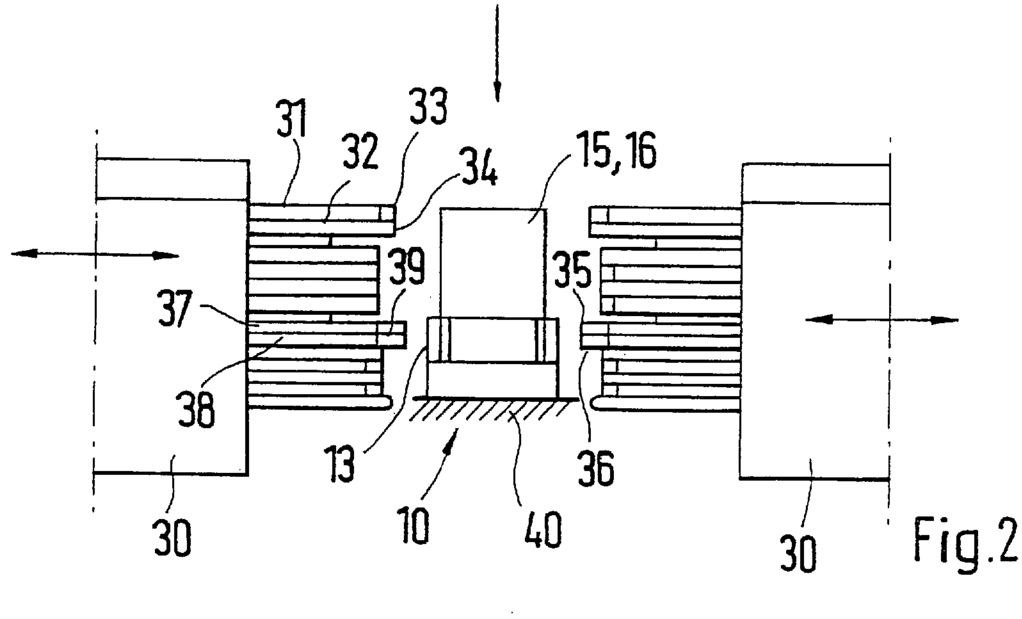
FIG. 2 shows the connector plug and displacing jaws in a side view.

The method according to the present invention will be explained in more detail with reference to a schematically depicted apparatus that is shown in FIGS. 1 and 2. Connector plug 10, to which a wiring harness can already be attached, is introduced between two displacing jaws 30, the introduction movement being limited by stop 40. Connector plug 10 then assumes, as shown by FIG. 2, a defined position in this introduction direction. Displacing jaws 30 are directed with positioning extensions 33 and 34 toward positioning receptacles 15 and 16 of connector plug 10, while spreader extensions 35 and 36 of right-hand displacing jaw 30 are directed toward opening 17 of U-shaped ring 13 enclosing half-shells 11 and 12, and retaining extensions 39 of left-hand displacing jaw 30 are directed toward the side of spring 13 facing away from opening 17. Positioning extensions 33 and 34 are shaped onto places 31 and 32 of the two displacing jaws so that they can be brought, on opposite sides from one another, into working engagement with positioning receptacles 15 and 16 of connector plug 10.

The two half-shells 11 and 12 form, on the sides facing toward one another, a slot-shaped receptacle 14 that is held in the closed position by the tension of spring 13.

Figure 3:
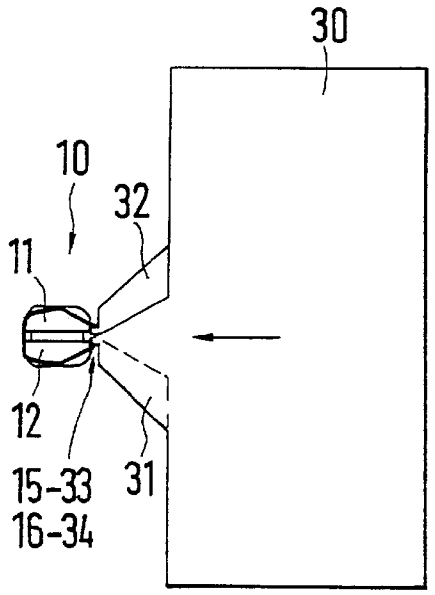
FIG. 3 shows a partial plan view of the connector plug positioned against the displacing jaws.
Figure 4:
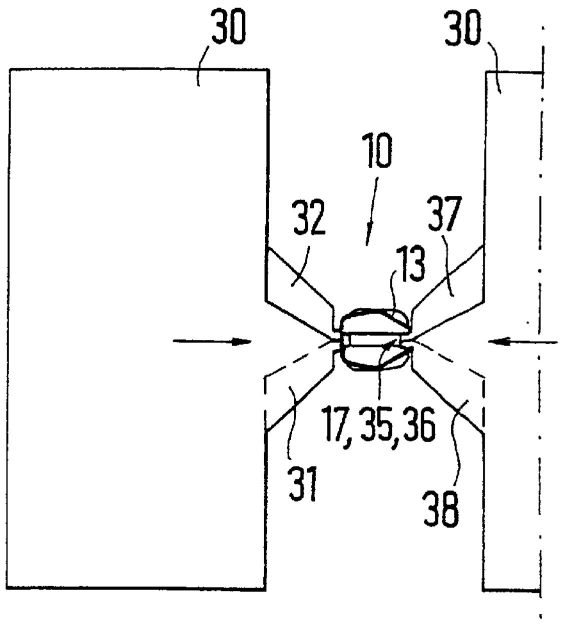
FIG. 4 shows, in plan view, the connector plug in working engagement with positioning and spreader extensions of the displacing jaws.
Figure 5:
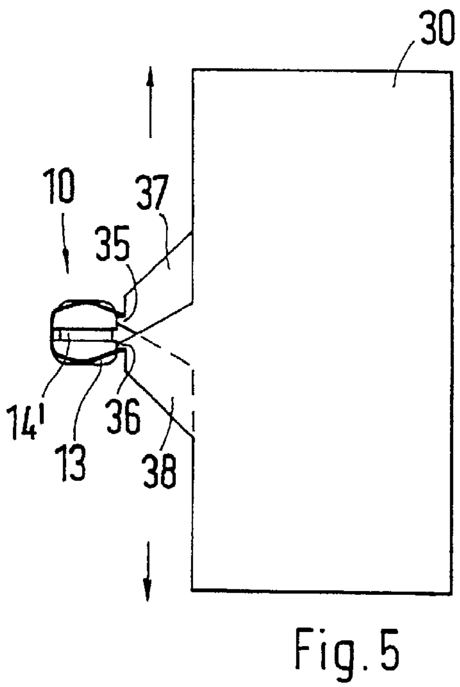
FIG. 5 shows a partial plan view in which the spring is spread and the receptacle between the half-shells of the connector plug is enlarged.

Once connector plug 10 has been prepositioned in this manner, displacing jaws 30 are then brought against connector plug 10 parallel to the wide side of receptacle 14. Positioning extensions 33 and 34 of places 31 and 32 can thereby, as shown in FIG. 3, come into engagement with positioning receptacles 15 and 16 of half-shells 11 and 12. Connector plug 10 is thus also positioned in the direction of the narrow side of receptacle 14. Spreader extensions 35 and 36 of plates 37 and 38 of right-hand displacing jaw 30 can then be introduced into opening 17 of spring 13, as shown in FIG. 4. In this context, spring 13 can be retained, on the side located opposite opening 17, by retaining extension 39 of left-hand displacing jaw 30. By displacement of plates 37 and 38 in opposite directions, spring 13 is spread over a predefined displacement travel, as shown in FIG. 5, over-extension of spring 37 being prevented. Half-shells 11 and 12 can then track the spreading of spring 13 in stress-free fashion. It is possible, for this purpose, to use tracking extensions on displacing jaws 30 and tracking receptacles 15 and 16, which are also displaceable in opposite directions but track spreader extensions 35 and 36 with a delay so as not to press half-shells 11 and 12 against spring 13.

Positioning extensions 33 and 34 and the tracking extensions of displacing jaws 30 can also coact with positioning and tracking surfaces of connector plug 10. The positioning and tracking extensions of displacing jaws 30 transfer to the half-shells 11 and 12 of connector plug 10 a displacement movement that runs in the same direction as the spreading movements of spreader extensions 35 and 36.

Once the receptacle between half-shells 11 and 12 has been enlarged, as indicated by 14' in FIG. 5, the probe circuit board can then be introduced into the enlarged receptacle 14' with no risk of damage to the circuit board, contacts, or half-shells.

Figure 6:
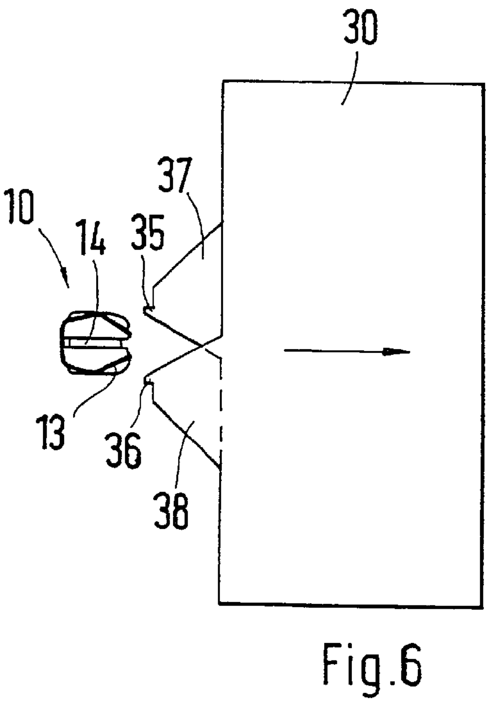
FIG. 6 shows, in plan view, the connector plug released by the displacing jaws.

When spreader extensions 35 and 36 release spring 13, its tension causes the circuit board to be retained between half-shells 11 and 12, thereby ensuring a sufficient contact pressure between the circuit board contacts and the mating contacts of half-shells 11 and 12, as indicated in FIG. 6. In this context, the tracking extensions and/or positioning extensions can also be brought out of working engagement with half-shells 11 and 12 before spreader extensions 35 and 36.

Figure 7:
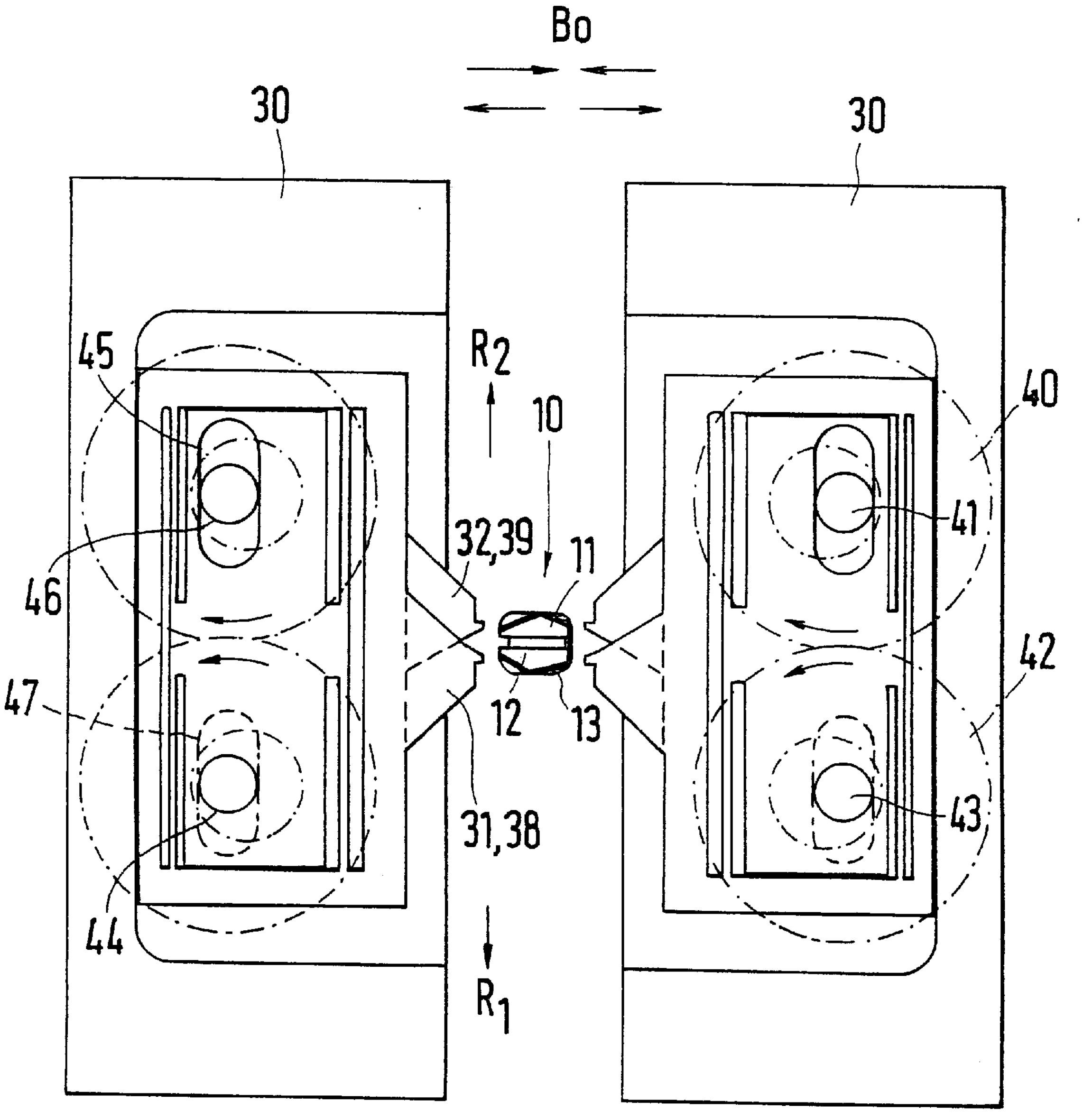
FIG. 7 shows, in plan view, an apparatus having displacing jaws whose positioning and spreader extensions are displaceable in opposite directions.

As FIG. 7 shows, the apparatus for carrying out the method comprises two displacing jaws 30 that are movable in movement direction B0 toward and away from one another, as illustrated by the double arrows labeled B0. Displacing jaws 30 can thereby be brought into contact against connector plug 10 or release it for removal.

Each displacing jaw 30 comprises a stack of plates arranged one above another, as clearly shown by the plates labeled 31, 32, 37, and 38 in FIG. 7. One group of plates, e.g. 31 and 37, is displaceable in displacement direction $R_1$, while another group of plates, e.g. 32 and 38, is displaceable in the opposite direction $R_2$, as shown by the arrows labeled $R_1$ and $R_2$. The displacement movements can also each be performed again in the opposite direction.

Plates 31 and 37 that are displaceable in direction $R_1$ have a receiving orifice 44 into which a first displacement stud 43 is inserted, while plates 32 and 38 that are displaceable in direction $R_2$ have a receiving orifice 46 for a second displacement stud 41. To ensure that second displacement stud 41 does not adversely affect the displacement of plates 31 and 37 that are displaceable in direction $R_1$, it is guided in an elongated guide hole 45 of those plates. These elongated guide holes 45 allow displacement of plates 31 and 37 over the maximum displacement travel on second displacement studs 41 that are also displacing.

In the same manner, plates 32 and 38 that are displaceable in direction $R_2$ have elongated guide holes 47 for first displacement stud 43. Elongated guide holes 45 and 47 in plates 31, 37, and 32, 38 take into account, in their dimensions in displacement directions $R_1$ and $R_2$, the maximum displacement travels considering that the positions of displacement studs 41 and 43 also change during their opposite-direction movement i.e. their spacing becomes greater or smaller.

The displacement movement of displacement studs 41 and 43 is derived from two drive wheels 40 and 42 driven in opposite rotation directions, since they are arranged as eccentric studs on drive wheels 40 and 42. These drive wheels 40 and 42 are advantageously configured as gear wheels that are in engagement with one another . . . it is thus sufficient to drive only one of these gear wheels, the rotation direction determining whether positioning extensions 33 and 34 of plates 31 and 32, and spreader extensions 35 and 36 of plates 37 and 38, are moved away from or toward one another.

Positioning extensions 33 and 34 and spreader extensions 35 and 36 are distributed within the stack depth in accordance with the distribution on connector plug 10 of positioning receptacles 15 and 16 or the positioning surfaces, and of opening 17 of spring 13, and can be directed toward them.

The stack of plates 31, 32, 37, and 38 of the two displacing jaws 30 can be guided displaceably in a mount in directions $R_1$ and $R_2$. The mount is part of displacing jaws 30, and can also guide both stacks displaceably. In movement direction $B_0$, displacing jaws 30 can in turn be displaceably guided in another mount. These linear guides can be implemented in various ways in known fashion; the displacing devices can also be of known kinds.

It is also possible, of course, to equip plates of the stack with tracking extensions for half-shells 11 and 12 of connector plug 10. For other applications of the apparatus, it is also possible to configure other extensions for gripping, holding, pulling apart, or fitting together other objects.

What is claimed is:

1. A method for connecting a probe including electrical connections terminating on a circuit board and capable of being introduced into a receptacle of a connector plug including a plurality of half-shells that form a receptacle for the circuit board and carry on sides facing one another mating contacts for the connections of the circuit board, the half-shells being held together under tension by a U-shaped spring that surrounds the half-shells, the method comprising the steps of:

introducing the connector plug between a plurality of displacing jaws;

positioning the connector plug such that spreader extensions of the displacing jaws are directed toward an opening of the spring;

spreading the spring apart over a predefined displacement by achieving an opposite-direction displacement of the spreader extensions introduced into the opening of the spring; and introducing the circuit board into the receptacle between the half-shells, the receptacle being capable of being enlarged, wherein the circuit board is held under tension between the half-shells of the connector plug by the spring as a result of at least one of a contraction and an extension of the spreader extensions.

2. The method according to claim 1, wherein the step of positioning the connector plug is performed by positioning extensions of the displacing jaws according to one of the steps of:

introducing the positioning extensions into positioning receptacles of the half-shells, and bringing the positioning extensions into contact against positioning surfaces of the half-shells, wherein the positioning extensions are displaced synchronously with the spreader extensions.

3. The method according to claim 2, further comprising a performance of one of the steps of:

introducing the displacing jaws with tracking extensions into associated tracking receptacles of the half-shells; and placing the displacing jaws against tracking surfaces of the half-shells, wherein an opposite-direction displacement of the tracking extensions of the half-shells of the connector plug tracks, in a stress-free-fashion, the spreading of the spring.

4. The method according to claim 1, further comprising the step of:

detaching the probe from the connector plug by pulling the circuit board of the probe out of the receptacle when expanded between the half-shells as a result of the spring being spread.

5. The method according to claim 1, wherein:

a movement by which the connector plug is introduced between the displacing jaws is limited by stops defining a positioning of the connector plug in a direction in which the connector plug is introduced between the displacing jaws.

6. The method according to claim 3, wherein:

the displacing jaws are displaced parallel to a wide side of the receptacle between the half-shells of the connector plug, and the spreader extensions, the positioning extensions, and the tracking extensions are respectively displaced in opposite directions, but parallel to a narrow side of the receptacle.

7. The method according to claim 1, further comprising the step of:

causing a retaining extension of one of the displacing jaws to retain the spring on a side facing away from the opening.

8. An apparatus for connecting a probe including electrical connections terminating on a circuit board and capable of being introduced into a receptacle of a connector plug including a plurality of half-shells that form a receptacle for the circuit board and carry on sides facing one another mating contacts for the connections of the circuit board, the half-shells being held together under tension by a U-shaped spring that surrounds the half-shells, comprising:

a plurality of displacing jaws arranged on both sides of the connector plug, the displacing jaws being movable toward and away from one another, wherein the displacing jaws include a plurality of plates arranged one above another;

a plurality of positioning extensions arranged on a side of the plates; and a plurality of spreader extensions arranged on a side of the plates facing the side of the plates on which the positioning extensions are arranged, wherein:

the plates are displaceable in opposite directions perpendicular to displacing movements of the displacing jaws, the plates that are displaceable in one of the opposite directions are equipped with a first receiving orifice for a first displacement stud, the plates that are displaceable in another one of the opposite directions are equipped with a second receiving orifice for a second displacement stud, the plates that are displaceable in the one of the opposite directions include an elongated guide hole for the second displacement stud, the plates that are displaceable in the other one of the opposite directions includes an elongated guide hole for the first displacement stud, and the first displacement stud and the second displacement stud are arranged, as eccentric studs, on drive wheels capable of being driven in opposite rotation directions.

9. The apparatus according to claim 8, wherein:

the drive wheels are configured as gear wheels that are in engagement with one another, and at least one of the gear wheels is drivable.

10. The apparatus according to claim 8, wherein:

the elongated guide hole for the first displacement stud and the elongated guide hole for the second displacement stud are respectively oriented in the opposite directions of the displacements of the plates, and each one of the elongated guide hole for the first displacement stud and the elongated guide hole for the second displacement stud includes a respective longitudinal dimension that is greater than a maximum displacement travel of the plates.

11. The apparatus according to claim 8, wherein:

the positioning extensions, the spreader extensions, and tracking extensions are capable of being directed, within a stack height, toward positions of one of positioning receptacles and positioning surfaces on the connector plug introduced between the displacing jaws, and the spreader extensions are capable of being directed toward a position of an opening of the spring.

12. The apparatus according to claim 4, wherein:

the positioning extensions, the spreader extensions, and the tracking extensions extend over at least one of the plates.

13. The apparatus according to claim 8, wherein:

the plates are manufactured as stamped parts from sheet steel.

14. The apparatus according to claim 8, wherein:

the plates are guided displaceably in a mount.

* * * * *